US006809602B2

(12) United States Patent
Boerstler et al.

(10) Patent No.: US 6,809,602 B2
(45) Date of Patent: Oct. 26, 2004

(54) MULTI-MODE VCO

(75) Inventors: David W. Boerstler, Round Rock, TX (US); Gary D. Carpenter, Pflugerville, TX (US); Hung C. Ngo, Austin, TX (US); Kevin J. Nowka, Round Rock, TX (US)

(73) Assignee: International Business Machines Corporation, Armonk, NY (US)

( * ) Notice: Subject to any disclaimer, the term of this patent is extended or adjusted under 35 U.S.C. 154(b) by 136 days.

(21) Appl. No.: 09/974,969

(22) Filed: Oct. 11, 2001

(65) Prior Publication Data

US 2003/0071691 A1 Apr. 17, 2003

(51) Int. Cl.[7] .............................................. H03B 27/00
(52) U.S. Cl. ..................... 331/57; 331/177 R; 331/179; 327/158; 327/159
(58) Field of Search .............................. 331/57, 177 R, 331/179; 327/158, 159

(56) References Cited

U.S. PATENT DOCUMENTS

| | | | | |
|---|---|---|---|---|
| 5,418,499 A | * | 5/1995 | Nakao | 331/57 |
| 5,434,525 A | * | 7/1995 | Leonowich | 327/278 |
| 5,815,043 A | * | 9/1998 | Chow et al. | 331/57 |
| 6,298,448 B1 | | 10/2001 | Shaffer et al. | 713/322 |

* cited by examiner

Primary Examiner—Arnold Kinkead
(74) Attorney, Agent, or Firm—Richard F. Frankeny; Winstead Sechrest & Minick P.C.; Casimer K. Salys

(57) ABSTRACT

A voltage controlled oscillator (VCO) is constructed using a series ring connection of an odd number K of logic inverters where K is greater than three. Each sequence of three of the logic inverters has voltage controlled feed-forward conduction circuit coupled in parallel. Each of the feed-forward circuits has the same phase between its input and output as the path it parallels. The control voltage of the feed-forward circuits operates to decrease the path delay of the logic inverters when they are conducting. Selectable inverters are connected in parallel with each logic inverter using a P and an N channel field effect transistor (FET). The N channel FET is controlled with a Mode signal and the P channel FET is controlled by a Modeb signal which is generated by inverting the Mode signal. The Mode and Modeb signals control the connection of the selectable inverters are in parallel with the logic inverters thus increasing the drive capability of the parallel combination of inverters. This reduces the delay of the circuit elements and generates a second higher frequency range over which the VCO operates. When the selectable inverters are disconnected, the VCO has a normal lower frequency range of operation.

24 Claims, 7 Drawing Sheets

MULTI-MODE VCO

CROSS REFERENCE TO RELATED APPLICATION

The present invention is related to the following U.S. patent applications which are incorporated by reference:

Ser. No. 09/974,990 now U.S. Pat. No. 6,501,304 entitled "Glitch-less Clock Selector" filed concurrently herewith, Ser. No. 09/974,987, now U.S. Pat. No. 6,483,888 entitled "Clock Divider With Bypass" filed concurrently herewith, Ser. No. 09/975,187, now U.S. Pat. No. 6,529,082 entitled "Dual-mode Charge Pump" filed concurrently herewith, Ser. No. 09/974,985 now U.S. Pat. No. 6,515,530 entitled "Dynamically Scaled Low Voltage Clock Generator System" filed concurrently herewith, Ser. No. 09/974,986, now U.S. Pat. No. 6,529,084 entitled "Interleaved Feedforward VCO and PLL" filed concurrently herewith, Ser. No. 09/726,285, now U.S. Pat. No. 6,353,369 entitled "A Multiphase Voltage Controlled Oscillator With Variable Gain and Range" filed Nov. 30, 2000, and Ser. No. 09/726,282, now U.S. Pat. No. 6,559,727 entitled "A High-Frequency Low-Voltage Multiphase Voltage-Controlled Oscillator" filed Nov. 30, 2000.

TECHNICAL FIELD

The present invention relates in general to circuits for generating clocks using a voltage-controlled oscillator circuit.

BACKGROUND INFORMATION

Phase-locked loops (PLL's) have been widely used in high-speed communication systems because PLL's efficiently perform clock recovery or clock generation at a relatively low cost. Dynamic voltage and frequency scaling is a critical capability in reducing power consumption of power sensitive devices. Scaling, in this sense, means the ability to select high performance with nominal power supply voltages and high frequency clock operation or low performance by reducing the power supply voltage and corresponding the clock frequency. Reducing the system power is usually done when performance is not needed or when running from a limited energy source such as a battery. To allow low power operation, the PLL and other circuits must support very aggressive power/energy management techniques. For the PLL this means low power operation while supporting key required features such as dynamic frequency scaling, dynamic voltage scaling, clock freezing and alternate low frequency clocking. Dynamic implies that the PLL is able to support changes in the output frequency and logic supply voltage without requiring the system to stop operation or waiting for the PLL clock to reacquire lock.

Using a PLL or delay-locked loop (DLL) has advantages in a battery powered system because a PLL is able to receive a lower frequency reference frequency from a stable oscillator to generate system clock frequencies. A PLL also allows changing the system clock frequency without changing the reference frequency. The prior art has described ways of selecting operating points of voltage and frequency statically, for example stopping execution while allow the PLL to frequency lock to a new frequency. This slows system operations and complicates system design.

One of the key circuits in a PLL is a voltage-controlled oscillator (VCO). Circuits in the PLL generate an error voltage that is coupled to the VCO to control the frequency of the VCO output. By frequency dividing the output of the PLL and feeding it back and comparing it to a low frequency crystal-controlled reference clock, a stable high frequency clock may be generated. The VCO in a PLL typically has a range over which the frequency of the VCO may be voltage-controlled. In systems employing frequency scaling, it is desirable to have a voltage-controlled frequency range for normal voltage operation and another voltage-controlled frequency range for low voltage operation without resorting to two VCOs.

There is, therefore, a need for a way to have a VCO with two voltage-controlled frequency ranges which are logic selectable.

SUMMARY OF THE INVENTION

A voltage-controlled oscillator (VCO) has an odd number of logic inverters in a ring oscillator configuration. A transfer gate is connected across every two series inverters in a feed-forward configuration. The conductance of the transfer gate is varied with control voltages. The control voltages are adjusted within a feedback loop to control the frequency of the VCO. If the transfer gate circuits are OFF, the VCO operates at its lowest frequency and as the transfer gate circuits are turned ON by the control voltage, the frequency of the VCO increases until an upper frequency is achieved. A controlled inverter is coupled in parallel with each of the logic inverters using two metal oxide semiconductor (MOS) switch transistors. The two MOS switch transistors connect the inverters in one mode and disconnect the inverters in the second mode. The gates of the two MOS switches are controlled by a mode signal and the complement of the mode signal. When the controlled inverters are connected, the frequency range of the VCO is increased and when the inverters are disconnected the frequency range of the VCO reverts to its normal operating range. Within each frequency range of the VCO, the control voltages vary the frequency of the VCO.

The foregoing has outlined rather broadly the features and technical advantages of the present invention in order that the detailed description of the invention that follows may be better understood. Additional features and advantages of the invention will be described hereinafter which form the subject of the claims of the invention.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
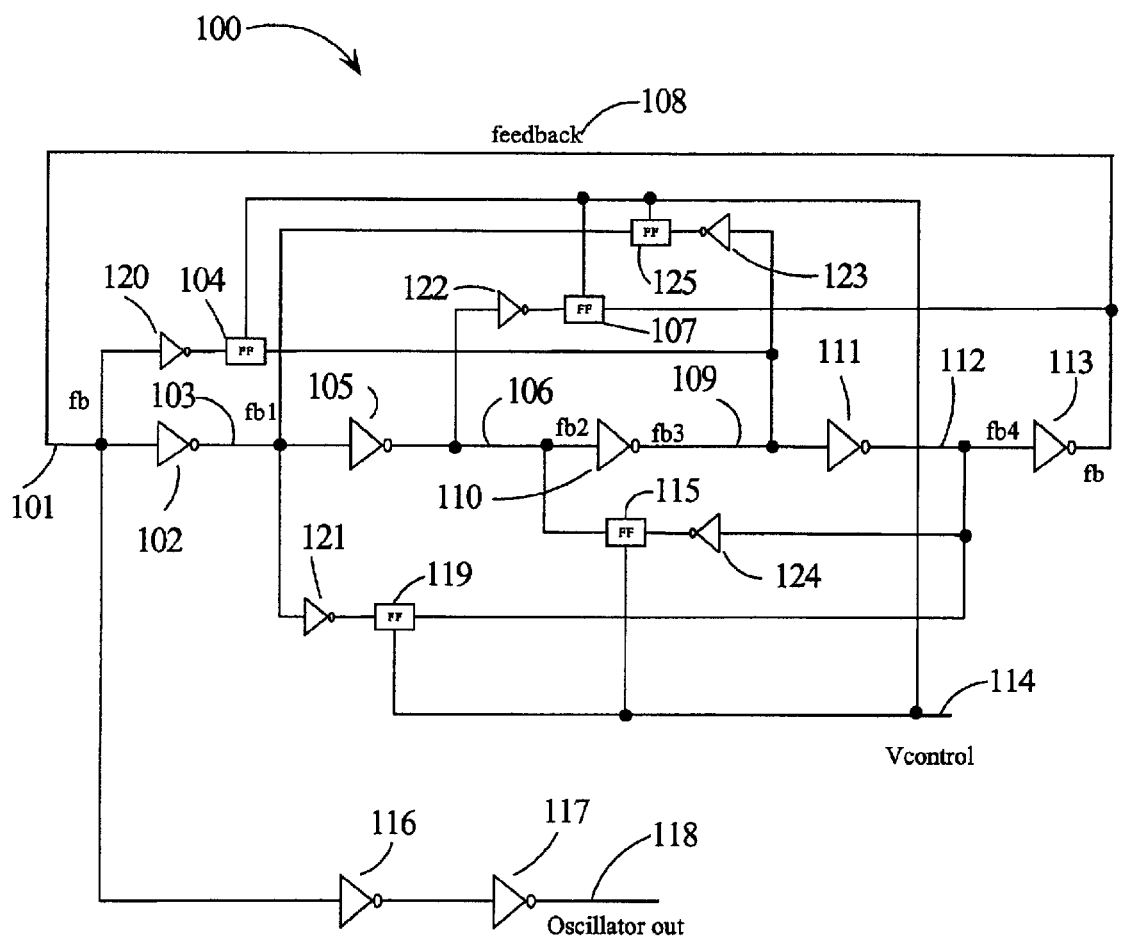
FIG. 1 is a block diagram of a prior art voltage-controlled oscillator (VCO) using a feed-forward element which is varied with a control voltage.

In the following description, numerous specific details are set forth to provide a thorough understanding of the present invention. However, it will be obvious to those skilled in the art that the present invention may be practiced without such specific details. In other instances, well-known circuits have been shown in block diagram form in order not to obscure the present invention in unnecessary detail. For the most part, details concerning timing considerations and the like have been omitted in as much as such details are not necessary to obtain a complete understanding of the present invention and are within the skills of persons of ordinary skill in the relevant art.

Refer now to the drawings wherein depicted elements are not necessarily shown to scale and wherein like or similar elements are designated by the same reference numeral through the several views. In the following detailed descriptions, a logic zero is a low or zero voltage and a logic one is a high or a plus supply voltage to simplify explanation of embodiments of the present invention.

Figure 3:
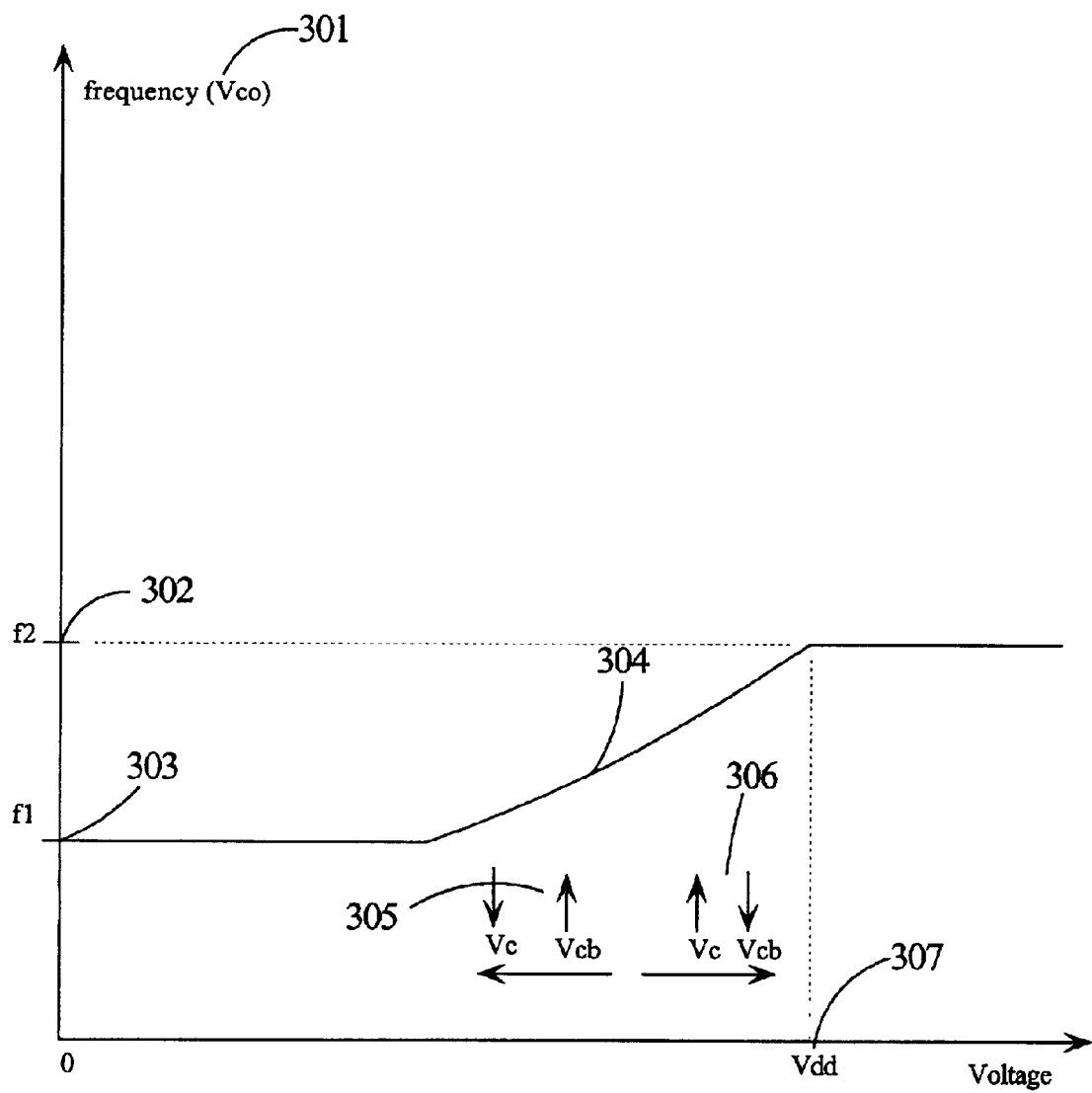
FIG. 3 is a voltage versus frequency diagram showing how the frequency of the VCO in FIG. 1 varies as a function of the control voltages.

FIG. 1 is a prior art circuit diagram of a voltage-controlled oscillator (VCO) 100 using a feed-forward configuration. Inverters 102, 105, 110, 111, and 113 are connected in series, output to input, generating a ring of five inverters where the output of the fifth inverter is connected back to the input of the first inverter. Inverters 102, 105, 110, 111, and 113 form the primary path of VCO 100. Feed-forward elements 104, 119, 107, 125, and 115 are coupled between nodes of the primary path using inverters 120–124, respectively. If voltage controlled feed-forward elements 104, 107, 115, and 119 are not conducting (controlled by V control 114), then VCO 100 operates at its lowest frequency. If the feed-forward elements are active, they will conduct a current signal to a corresponding following inverter in proportion to the magnitude of the control voltage V control 114. Feedback 108 is the connection of the output of inverter 113 back to the input of inverter 102 forming node fb 101. The frequency range of the VCO 100 is limited between frequencies f2 302 and f1 303 as shown in FIG. 3. Inverters 116 and 117 perform the function of reshaping the signal fb 101 as the VCO output 118.

Figure 2:
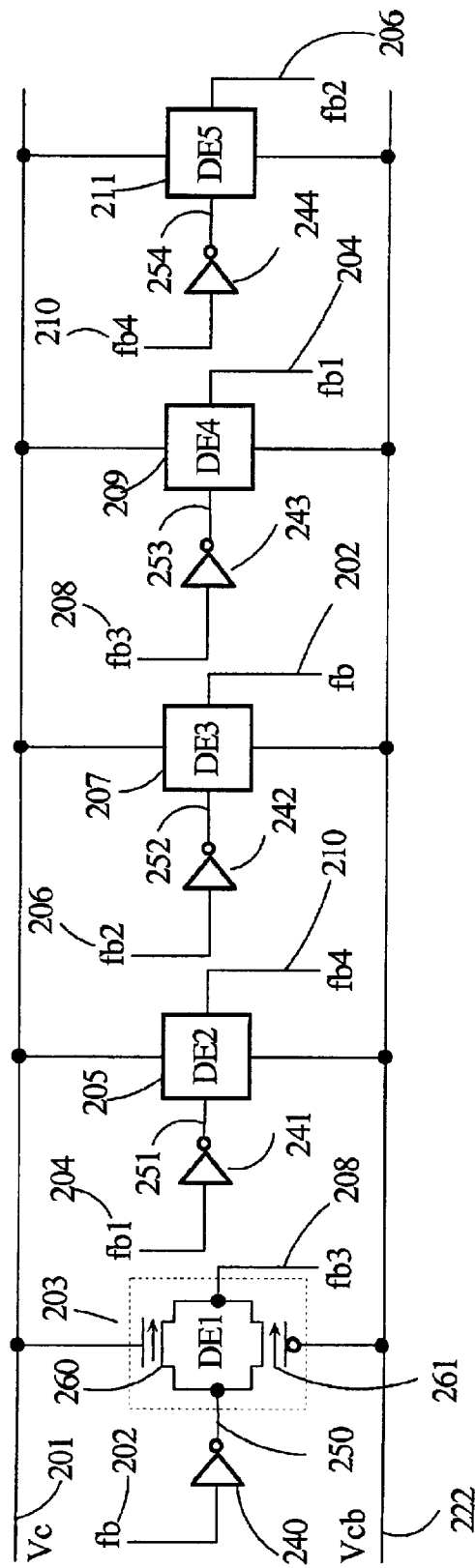
FIG. 2 is a circuit diagram of a prior art VCO showing the connections of the transfer gates and logic gates used to configure the VCO.
Figure 2:
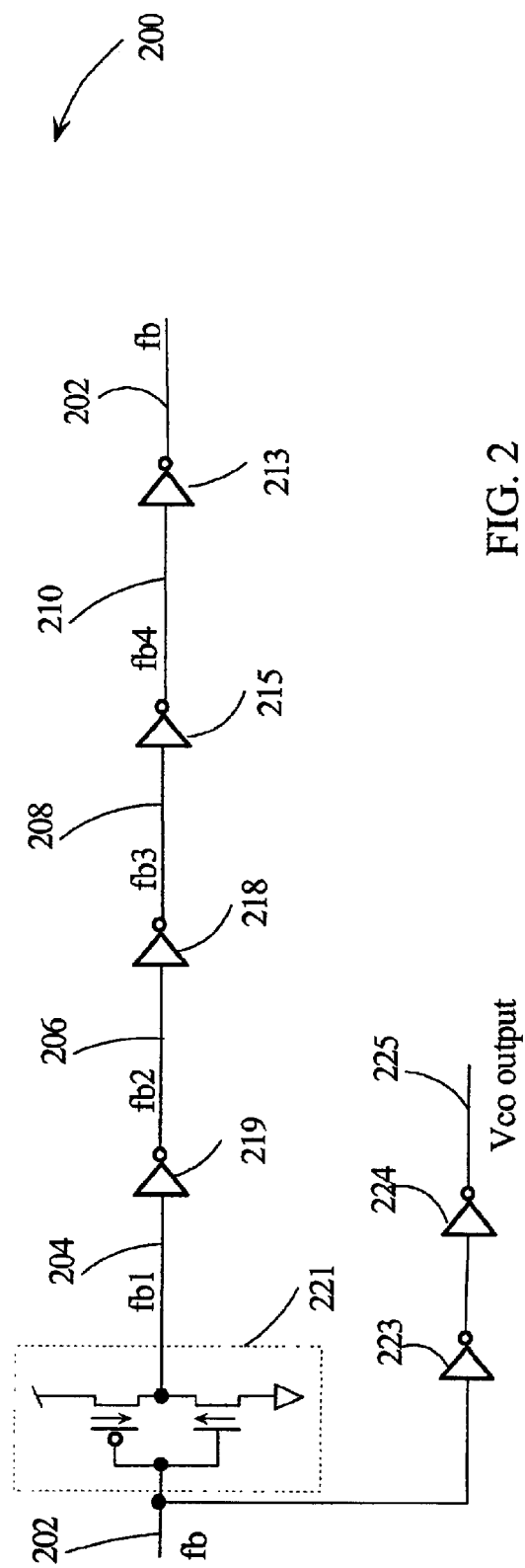

FIG. 2 is a prior art circuit diagram of a VCO 200 employing transfer gates as the feed-forward circuit elements. Transfer gates 203, 205, 207, 209 and 211 are controlled by opposing control voltages Vc 201 and Vcb 222. Although transfer gates are normally used for bi-directional switches, varying the gate voltages of the parallel devices varies the conductance. Transfer gate 203 shows the exemplary circuit comprising parallel N channel field effect transistor (NFET) 260 and P channel FET (PFET) 261 used in all of the transfer gates, DE1 203, DE2 205, DE3 207, DE4 209 and DE5 211. Inverters 221, 219, 218, 215, and 213 are connected in series forming nodes fb1 204, fb2 206, fb3 208, fb4 210, and fb 202 of the primary oscillator circuit path of VCO 200. Nodes 250–254 of the respective transfer gates, DE1 203, DE2 205, DE3 207, DE4 209 and DE5 211 are connected to the primary path using inverters 240–244, respectively. The output of transfer gates DE1 203, DE2 205, DE3 207, DE4 209 and DE5 211 are labeled corresponding to the circuit node to which they are connected. The output of DE1 203 is connected to fb3 208, the output of DE2 205 to fb4 210, the output of DE3 207 to fb 202, the output of DE4 209 to fb1 204, and the output of DE5 211 to fb2 206. This connection of the inverters and transfer gates results in a normal propagation path and a parallel feed-forward path. For example, the feed-forward path including DE1 203 is in parallel with the series connection of inverters 221, 219 and 218 (from fb 202 to fb3 208). A signal transition on fb 202 will result in a corresponding opposite transition on node fb3 208 at a delay time determined by the delay of primary path inverters 221, 219 and 218. At the time of a transition on fb 202, fb3 208 will be static at awaiting the transition through inverters 221, 219 and 218. If transfer gate DE1 203 is in an ON state from the level of Vc 201 and Vcb 222, then the path through inverter 240 and DE1 203 will result in the transition occurring earlier. This speeds up the primary path and causes VCO 200 to have a higher frequency. All the feed-forward paths comprising inverter 241 and DE2 205, inverter 242 and DE3 207, inverter 243 and DE4 209, and inverter 244 and DE5 211 operate in the same fashion. As control voltages Vc 201 and Vcb 222 are varied, the transfer gates DE1 203, DE2 205, DE3 207, DE4 209 and DE5 211 may be operated from a point of cut-off where no conduction occurs to one of saturation where conduction is no longer affected by control voltages Vc 201 and Vcb 222. Inverter 223 and 224 are used to reshape the signal at node fb 202 to VCO output 225.

FIG. 3 illustrates the transfer function of the frequency of VCO output 225 versus control voltages Vc 201 and Vcb 222 for VCO 200. Frequency axis 301 shows the maximum operating frequency f2 302 and the minimum frequency f1 303. Segment 304 illustrates that the frequency changes monotonically from f1 303 to f2 302 in the range from a point of cut-off to saturation. Notation 305 illustrates that the frequency of VCO output 225 decreases (moving left on the transfer function) as the control voltages Vc 202 is decreased and Vcb 222 is correspondingly increased. Likewise, notation 306 illustrates that the frequency of the VCO output 225 increases as Vc 202 increases and Vcb 222 correspondingly decreases. Additional detail may be found by reference to the co-pending applications listed in the cross reference section of the present application.

Figure 4:
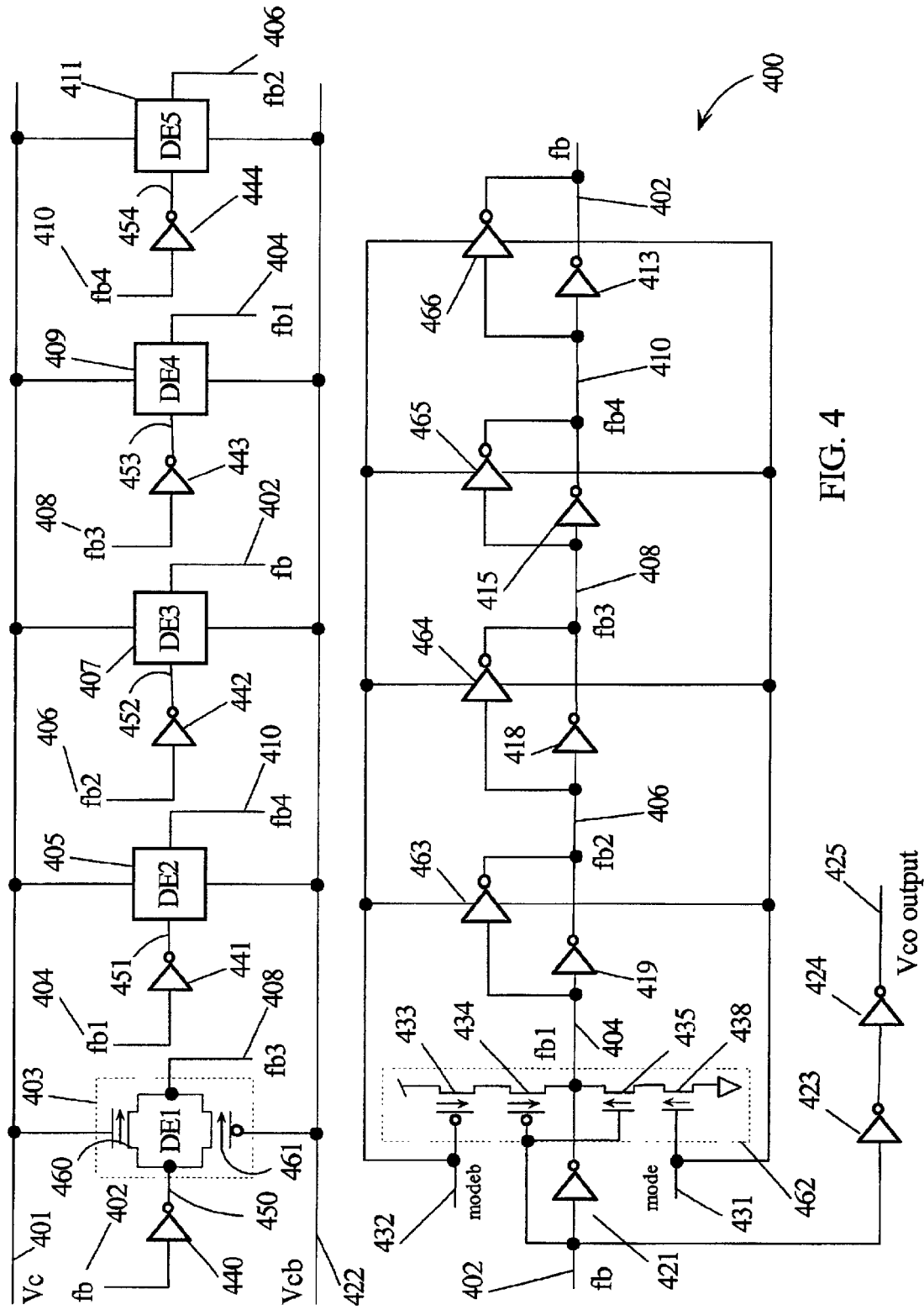
FIG. 4 is a circuit diagram of a VCO according to embodiments of the present invention with parallel inverters selectively switched into the circuit in response to mode signals.

FIG. 4 is a circuit diagram of a multi-mode VCO 400 according to embodiments of the present invention. Transfer gates DE1 403, DE2 405, DE3 407, DE4 409 and DE5 411 are controlled by opposing control voltages Vc 401 and Vcb 422. Transfer gate 403 shows the exemplary circuit comprising parallel N channel field effect transistor (NFET) 460 and P channel FET (PFET) 461 used in all of the transfer gates, DE1 403, DE2 405, DE3 407, DE4 409 and DE5 411. Inverters 421, 419, 418, 415, and 413 are connected in series forming nodes fb1 404, fb2 406, fb3 408, fb4 410, and fb 402 of the primary oscillator circuit path of VCO 400. Nodes 450–454 of the respective transfer gates, DE1 403, DE2 405, DE3 407, DE4 409 and DE5 411 are connected to the primary path using inverters 440–444, respectively. The output of transfer gates DE1 403, DE2 405, DE3 407, DE4 409 and DE5 411 are labeled corresponding to the circuit node to which they are connected. The output of DE1 403 is connected to fb3 408, the output of DE2 405 to fb4 410, the output of DE3 407 to fb 402, the output of DE4 409 to fb1 404, and the output of DE5 411 to fb2 406. This connection of the inverters and transfer gates results in a feed-forward paths parallel to the normal propagation paths. For example, the feed-forward path including DE1 403 is in parallel with the series connection of inverters 421, 419 and 418 (from fib 402 to fb3 408). A signal transition on fb 402 will result in a corresponding opposite transition on node fb3 408 at a delay time determined by the delay of primary path inverters 421, 419 and 418. At the time of a transition on fb 402, fb3 408 will be static awaiting the transition through inverters 421, 419 and 418. If transfer gate DE1 403 is in an ON state from the level of Vc 401 and Vcb 422, then the path through inverter 440 and DE1 403 will result in the transition occurring earlier. This speeds up the primary path and causes VCO 400 to have a higher frequency. All the feed-forward paths comprising inverter 441 and DE2 405, inverter 442 and DE3 407, inverter 443 and DE4 409, and inverter 444 and DE5 411 operate in the same fashion. As control voltages Vc 401 and Vcb 422 are varied, the transfer gates DE1 403, DE2 405, DE3 407, DE4 409 and DE5 411 may be operated from a point of cut-off where no conduction occurs to one of saturation where conduction is no longer affected by control voltages Vc 401 and Vcb 422. Inverter 423 and 424 are used to reshape the signal at node fb 402 to VCO output 425.

In embodiments of the present invention, additional switch selectable inverters 462, 463, 464, 465, and 466 are connected in parallel with inverters 421, 419, 418, 415, and 413, respectively. Selectable inverters 462, 463, 464, 465, and 466 are selected using mode control signals Mode 431 and Modeb 432. Exemplary selectable inverter 462 comprises a series connection of PFET 433, PFET 434, NFET 435, and NFET 438. Switch FETs PFET 433 and NFET 438 operate to connect the inverter function of PFET 434 and NFET 435 in parallel with inverter 421 in response to mode control signals, Mode 431 and Modeb 432. PFET 434 and NFET 435 are connected as a normal inverter with their gates electrodes and drain electrodes in common. The source electrode of PFET 434 is connected to the positive supply voltage by PFET 433 when Modeb 432 is a logic zero and the source electrode of NFET 438 is connected to the ground voltage when Mode 431 is a logic one. Modeb 432 is generated by the logic inversion of Mode 431, therefore, both PFET 433 and NFET 438 are either concurrently gated ON or OFF.

The delay of an inverter is directly related to its ability to drive its output node to an opposite logic state which in turn is related to its ON state conductivity and its size. Paralleling two inverters increases the drive capability of the resulting parallel inverting circuit over a single inverter thus reducing the circuit path delay. Reducing the circuit path delay has the effect of increasing the frequency of the VCO 400.

Each parallel switch selectable inverters 462–466 has the same circuit structure as shown for exemplary inverter 462. While the power supply connections to switch selectable inverters 463–466 are not shown, they are implied and are the same as inverter 462. When Mode 431 is a logic zero (and Modeb 432 is a logic one), selectable inverters 463–466 are gated OFF (disconnected from VCO 400) and the voltage controlled operation is as explained above with the frequency of VCO 400 having a low frequency operating range from f1 505 to f2 503 (see FIG. 5). When Mode 431 is a logic one (and Modeb 432 is a logic zero), selectable inverter 463–466 are gated ON (connected in parallel to corresponding inverters 421, 419, 418, 415 and 412) and VCO 400 has a high frequency range from f3 504 to f4 502 (see FIG. 5). In this manner, the multi-mode VCO 400 is logic selectable between two voltage controlled frequency ranges.

Figure 5:
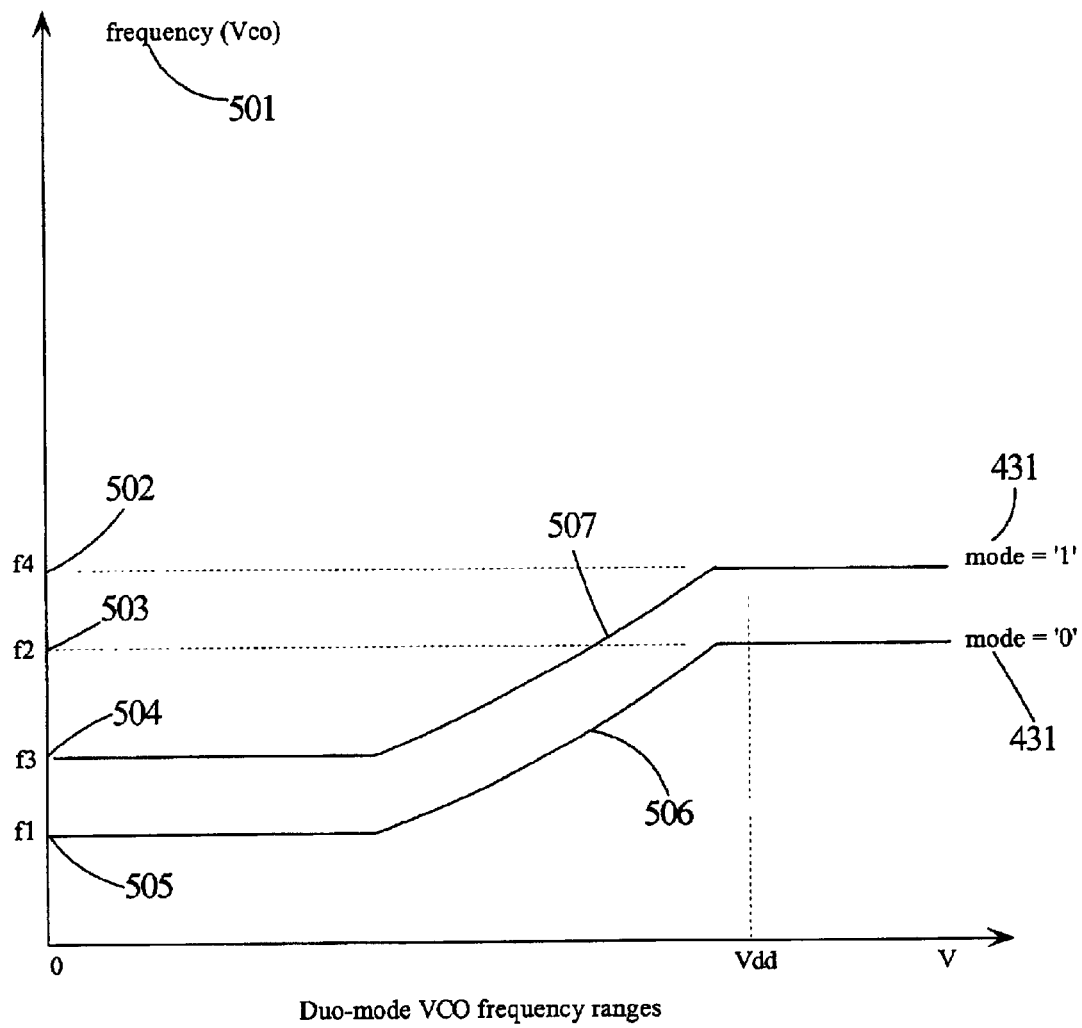
FIG. 5 is a voltage versus frequency diagram showing the dual frequency ranges of the VCO according to embodiments of the present invention.

FIG. 5 illustrates the transfer functions of control voltage versus output frequency for the two modes of VCO 400. The frequency axis 501 shows the two frequency ranges for Vco output 425; low frequency range f1 505 to f2 503 and high frequency range f3 504 to f4 502. Transfer function segments 507 and 506 show the monotonic voltage versus frequency characteristic of the high and low frequency ranges, respectively. The high frequency range is selected when Mode 431 is at a logic one and the low frequency range is selected when Mode 431 at a logic zero.

Figure 6:
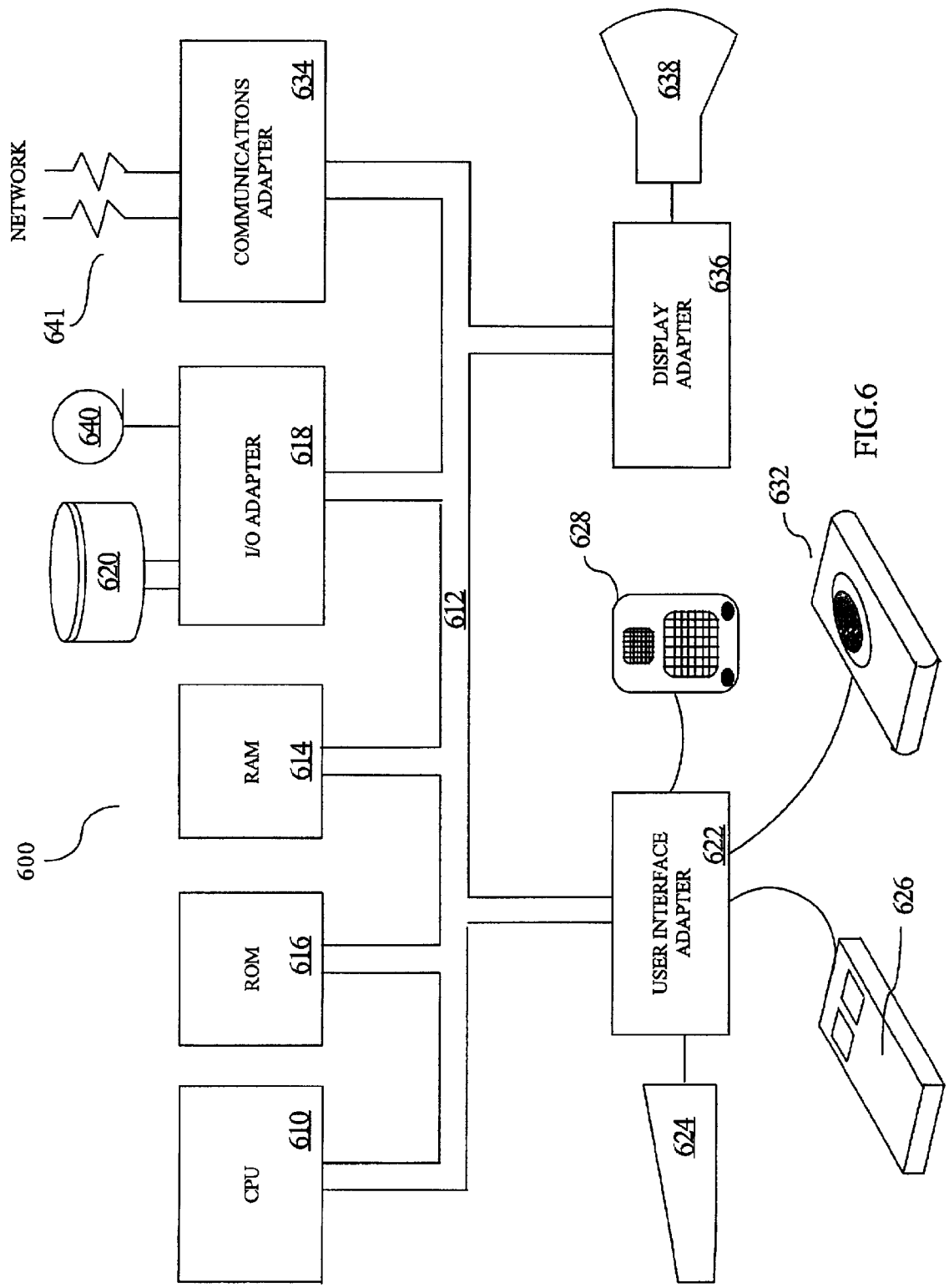
FIG. 6 is a block diagram of a data processing system suitable to use embodiments of the present invention for clock generation.

FIG. 6 is a high level functional block diagram of a representative data processing system 600 suitable for practicing the principles of the present invention. Data processing system 600, includes a central processing system (CPU) 610 operating in conjunction with a system bus 612. System bus 612 operates in accordance with a standard bus protocol, such that as the ISA protocol, compatible with CPU 610. CPU 610 operates in conjunction with electronically erasable programmable read-only memory (EEPROM) 616 and random access memory (RAM) 614. Among other things, EEPROM 616 supports storage the Basic Input Output System (BIOS) data and recovery code. RAM 614 includes, DRAM (Dynamic Random Access Memory) system memory and SRAM (Static Random Access Memory) external cache. I/O Adapter 618 allows for an interconnection between the devices on system bus 612 and external peripherals, such as mass storage devices (e.g., a hard drive, floppy drive or CD/ROM drive), or a printer 640. A peripheral device 620 is, for example, coupled to a peripheral control interface (PCI) bus, and I/O adapter 618 therefore may be a PCI bus bridge. User interface adapter 622 couples various user input devices, such as a keyboard 624, mouse 626, touch pad 632 or speaker 628 to the processing devices on bus 612. Display 638 which may be, for example, a cathode ray tube (CRT), liquid crystal display (LCD) or similar conventional display units. Display adapter 636 may include, among other things, a conventional display controller and frame buffer memory. Data processing system 600 may be selectively coupled to a computer or telecommunications network 641 through communications adapter 634. Communications adapter 634 may include, for example, a modem for connection to a telecom network and/or hardware and software for connecting to a computer network such as a local area network (LAN) or a wide area network (WAN). CPU 610 and other components of data processing system 600 may contain a PLL loop for generating clocks which operate with a dual mode VCO according to embodiments of the present invention.

Figure 7:
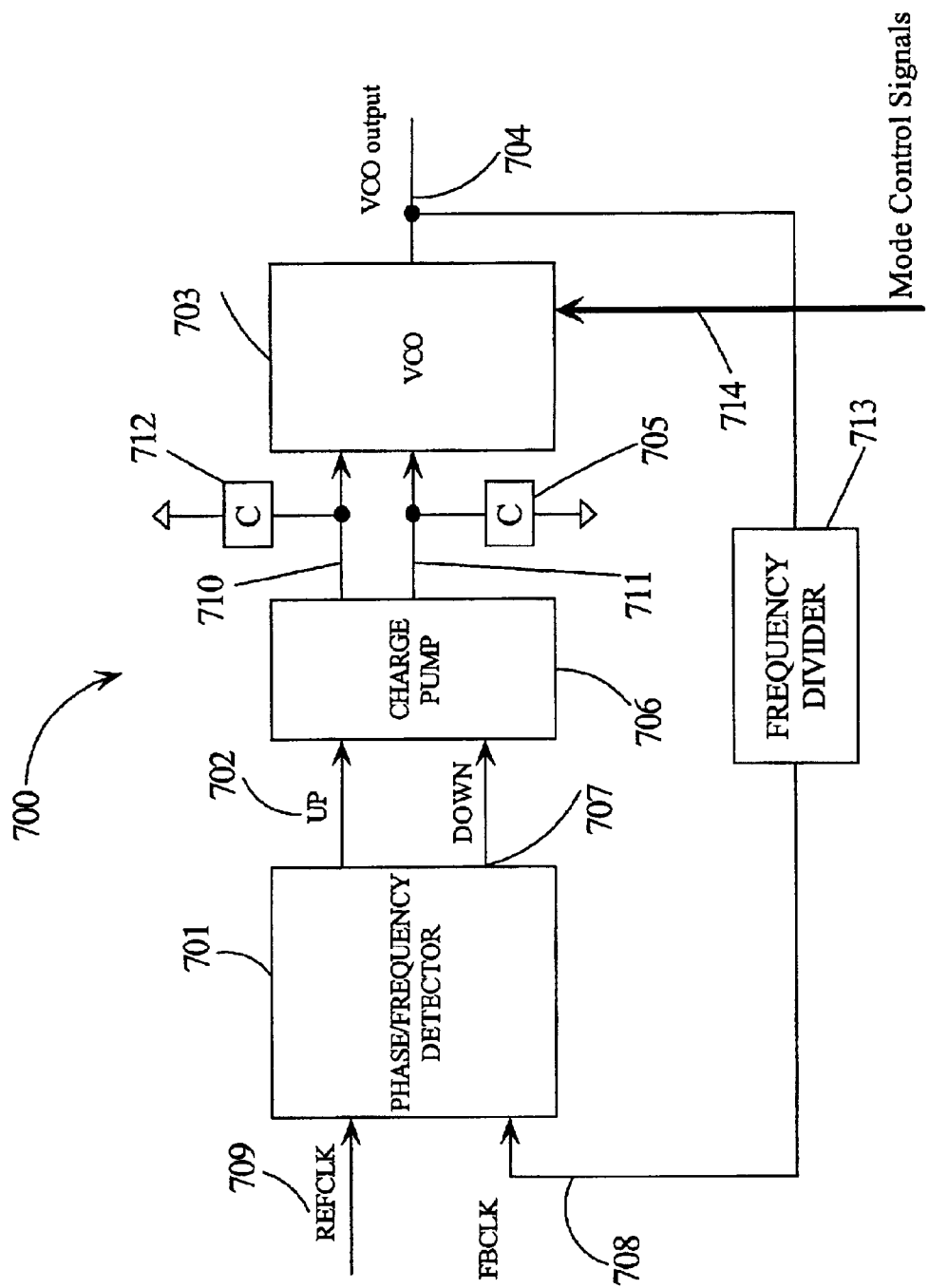
FIG. 7 is a block diagram of a phase lock loop suitable to use embodiments of the present invention.

FIG. 7 is a block diagram of a representative phase lock loop circuit 700 suitable for practicing the principles of the present invention. Reference clock (RCLK) 709 and feedback clock (FBCLK) 708 are compared in phase/frequency detector (PFD) 701 generating UP signal 702 and DOWN signal 707 which are applied as control signals to charge pump 706. UP signal 702 and DOWN signal 707 are used to control current sources in charge pump 706. Charge pump 706 has charge pump nodes 710 and 711. Capacitor 712 is coupled between charge pump node 710 and ground and capacitor 705 is coupled between charge pump node 711 and ground. UP signal 702 and DOWN 707 are generated in response to a lead or lag phase difference between RCLK 709 and FBCLK 708. Since RCLK 709 and FBCLK 708 cannot concurrently have a lead and a lag phase error, UP signal 702 and DOWN 707 are mutually exclusive signals. VCO output 704 is frequency divided by frequency divider 713 generating FBCLK 708. VCO 703 may have two frequency ranges controlled by Mode control signals 714 according to embodiments of the present invention. The differential signal between charge pump nodes 710 and 711 is used to control the frequency of VCO 703 within each of the frequency ranges.

The present invention and its advantages have been described in detail, it should be understood that various changes, substitutions and alterations can be made herein without departing from the spirit and scope of the invention as defined by the appended claims.

What is claimed is:

1. A multi-mode voltage-controlled oscillator (VCO) comprising:
    a ring oscillator circuit comprising a series connection of an odd number K of logic inverter gates, wherein K is greater than three;
    a forward conduction circuit having a first input, a first output, and receiving control inputs, said forward conduction circuit coupled in parallel with a selected sequence of logic inverter gates within said K logic inverter gates; and
    a selectable inverter circuit, having a first inverter input, a first inverter output and receiving a first mode control signal and a second mode control signal, said first inverter input coupled to a logic input of an Nth logic inverter gate and said first inverter output coupled to a logic output of said Nth logic inverter gate, said Nth logic inverter gate selected from said K logic inverter gates, wherein a frequency range of said multi-mode VCO is selected in response to states of said first and second mode control signals.

2. The multi-mode VCO of claim 1, wherein said selectable inverter circuit comprises:
    a selectable logic inverter gate having an input coupled to said first inverter input, an output coupled to said first inverter output, a first terminal for receiving a first power supply voltage, and a second terminal for receiving a second power supply voltage;
    a first electronic switch having a first control input receiving said first mode control signal, a first switch terminal receiving said first power supply voltage, and a second switch terminal coupled to said first terminal of said selectable inverter gate; and
    a second electronic switch having a second control input receiving said second mode signal, a third switch terminal receiving said second power supply voltage, and a fourth switch terminal coupled to said second terminal of said selectable inverter gate.

3. The multi-mode VCO of claim 1, wherein said forward conduction circuit comprises:
    a control inverter having a second input and a second output; and
    a bi-directional conduction circuit having a third input, a third output, a first control input, and a second control input, said second input coupled to said first input, said second output coupled to said third input, said third output coupled to said first output, said first control input coupled to a first control voltage, and said second control input coupled to a second control voltage.

4. The multi-mode VCO of claim 3, wherein said bi-directional conduction circuit comprises:
    a first P channel metal oxide semiconductor (PFET) having a first drain terminal, a first source terminal and a first gate terminal; and
    a first NFET having a second drain terminal, a second source terminal and a second gate terminal, wherein said first drain terminal and said second drain terminal are coupled to said third input, said first source terminal and said second source terminal are coupled to said third output, said first gate terminal is coupled to said first control input, and said second gate terminal is coupled to said second control input.

5. The multi-mode VCO of claim 2, wherein said first electronic switch comprises a PFET having a drain terminal, a source terminal and a gate terminal, said source terminal coupled to said first switch terminal, said drain terminal coupled to said second switch terminal, and said gate terminal coupled to said first control input.

6. The multi-mode VCO of claim 2, wherein said second electronic switch comprises an NFET having a drain terminal, a source terminal and a gate terminal, said source terminal coupled to said third switch terminal, said drain terminal coupled to said fourth switch terminal, and said gate terminal coupled to said second control input.

7. The multi-mode VCO of claim 1, wherein said selected sequence of logic inverter gates from said K logic inverter gates comprises a series of three inverter logic gates.

8. The multi-mode VCO of claim 1, wherein each of said K inverter logic gates of said ring oscillator are coupled in parallel with a corresponding one of said selectable inverter circuits.

9. A data processing system comprising:
    a central processor unit (CPU), operable to generate a clock signal with a phase lock loop (PLL) clock generator, having a ring oscillator circuit configured as a series connection of an odd number K of logic inverter gates, wherein K is greater than three,
    a forward conduction circuit having a first input, a first output, and receiving control inputs, said forward conduction circuit coupled in parallel with a selected sequence from said K logic inverter gates, and a selectable inverter circuit, having a first inverter input, a first inverter output and receiving a first mode control signal and a second mode control signal, said first inverter input coupled to a logic input of an Nth logic inverter gate and said first inverter output coupled to a logic output of said Nth logic inverter gate, said Nth logic inverter gate selected from said K logic inverter gates;
    a random access memory (RAM);
    a read only memory (ROM);
    an I/O adapter, and a bus system coupling said CPU to said ROM, said I/O adapter, and said RAM,
    wherein a frequency range of said ring oscillator circuit is selected in response to states of said first and second mode control signals.

10. The data processing system of claim 9, wherein said selectable inverter circuit comprises:
    a selectable logic inverter gate having an input coupled to said first inverter input, an output coupled to said first inverter output, a first terminal for receiving a first power supply voltage, and a second terminal for receiving a second power supply voltage;
    a first electronic switch having a first control input receiving said first mode control signal, a first switch terminal receiving said first power supply voltage, and a second switch terminal coupled to said first terminal of said selectable inverter gate; and
    a second electronic switch having a second control input receiving said second mode signal, a third switch terminal receiving said second power supply voltage, and a fourth switch terminal coupled to said second terminal of said selectable inverter gate.

11. The data processing system of claim 9, wherein said forward conduction circuit comprises:
    a control inverter having a second input and a second output; and
    a bi-directional conduction circuit having a third input, a third output, a first control input, and a second control input, said second input coupled to said first input, said second output coupled to said third input, said third output coupled to said first output, said first control input coupled to a first control voltage, and said second control input coupled to a second control voltage.

12. The data processing system of claim 11, wherein said bi-directional conduction circuit comprises:
   a first P channel metal oxide semiconductor (PFET) having a first drain terminal, a first source terminal and a first gate terminal; and
   a first NFET having a second drain terminal, a second source terminal and a second gate terminal, wherein said first drain terminal and said second drain terminal are coupled to said third input, said first source terminal and said second source terminal are coupled to said third output, said first gate terminal is coupled to said first control input, and said second gate terminal is coupled to said second control input.

13. The data processing system of claim 10, wherein said first electronic switch comprises a PFET having a drain terminal, a source terminal and a gate terminal, said source terminal coupled to said first switch terminal, said dram terminal coupled to said second switch terminal, and said gate terminal coupled to said first control input.

14. The data processing system of claim 10, wherein said second electronic switch comprises an NFET having a drain terminal, a source terminal and a gate terminal, said source terminal coupled to said third switch terminal, said drain terminal coupled to said fourth switch terminal, and said gate terminal coupled to said second control input.

15. The data processing system of claim 9, wherein said selected sequence of logic inverter gates from said K logic inverter gates comprises a series of three inverter logic gates.

16. The data processing system of claim 9, wherein each of said K inverter logic gates of said ring oscillator are coupled in parallel with a corresponding one of said selectable inverter circuits.

17. A phase lock loop (PLL) circuit comprising:
   a phase/frequency comparator receiving a reference clock signal and a feedback clock signal and generating a first control signal and a second control signal;
   a charge pump circuit receiving said first control signal and said second control signal and generating a charge pump output on a first and second charge pump nodes;
   a first capacitor and a second capacitor coupled to said first and said second charge pump nodes, respectively;
   a voltage controlled oscillator (VCO) having a ring oscillator circuit having a series connection of an odd number K of logic inverter gates, wherein K is greater than three;
   a forward conduction circuit having a first input, a first output, and receiving said charge pump output, said forward conduction circuit coupled in parallel with a selected sequence of logic inverter gates within said K logic inverter gates, and a selectable inverter circuit, having a first inverter input, a first inverter output and receiving a first mode control signal and a second mode control signal, said first inverter input coupled to a logic input of an Nth logic inverter gate and said first inverter output coupled to a logic output of said Nth logic inverter gate, said Nth logic inverter gate selected from said K logic inverter gates, wherein a frequency range of said VCO is selected in response to states of said first and second mode control signals; and
   a signal frequency divider receiving said VCO output signal and generating said feedback clock signal, wherein a frequency of said VCO is controlled in response to said charge pump output and said first and second mode control signals.

18. The PLL circuit of claim 17, wherein said selectable inverter circuit comprises:
   a selectable logic inverter gate having an input coupled to said first inverter input, an output coupled to said first inverter output, a first terminal for receiving a first power supply voltage, and a second terminal for receiving a second power supply voltage;
   a first electronic switch having a first control input receiving said first mode control signal, a first switch terminal receiving said first power supply voltage, and a second switch terminal coupled to said first terminal of said selectable inverter gate; and
   a second electronic switch having a second control input receiving said second mode signal, a third switch terminal receiving said second power supply voltage, and a fourth switch terminal coupled to said second terminal of said selectable inverter gate.

19. The PLL circuit of claim 17, wherein said forward conduction circuit comprises:
   a control inverter having a second input and a second output; and
   a bi-directional conduction circuit having a third input, a third output, a first control input, and a second control input, said second input coupled to said first input, said second output coupled to said third input, said third output coupled to said first output, said first control input coupled to a first control voltage, and said second control input coupled to a second control voltage.

20. The PLL circuit of claim 19, wherein said bi-directional conduction circuit comprises:
   a first P channel metal oxide semiconductor (PFET) having a first drain terminal, a first source terminal and a first gate terminal; and
   a first NFET having a second drain terminal, a second source terminal and a second gate terminal, wherein said first drain terminal and said second drain terminal are coupled to said third input, said first source terminal and said second source terminal are coupled to said third output, said first gate terminal is coupled to said first control input, and said second gate terminal is coupled to said second control input.

21. The PLL circuit of claim 20, wherein said first electronic switch comprises a PFET having a drain terminal, a source terminal and a gate terminal, said source terminal coupled to said first switch terminal, said drain terminal coupled to said second switch terminal, and said gate terminal coupled to said first control input.

22. The PLL circuit of claim 20, wherein said second electronic switch comprises an NFET having a drain terminal, a source terminal and a gate terminal, said source terminal coupled to said third switch terminal, said drain terminal coupled to said fourth switch terminal, and said gate terminal coupled to said second control input.

23. The PLL circuit of claim 19, wherein said selected sequence of logic inverter gates from said K logic inverter gates comprises a series of three inverter logic gates.

24. The PLL circuit of claim 17 wherein each of said K inverter logic gates of said ring oscillator are coupled in parallel with a corresponding one of said selectable inverter circuits.

* * * * *

UNITED STATES PATENT AND TRADEMARK OFFICE
CERTIFICATE OF CORRECTION

PATENT NO. : 6,809,602 B2
DATED : October 26, 2004
INVENTOR(S) : David W. Boerstler et al.

It is certified that error appears in the above-identified patent and that said Letters Patent is hereby corrected as shown below:

Column 8,
Line 40, following "adapter" please replace "," with -- ; --.

Column 9,
Line 22, please replace "dram" with -- drain --.

Signed and Sealed this

Tenth Day of May, 2005

JON W. DUDAS
*Director of the United States Patent and Trademark Office*